(12) United States Patent
Kurita et al.

(10) Patent No.: US 6,833,717 B1
(45) Date of Patent: Dec. 21, 2004

(54) ELECTRON BEAM TEST SYSTEM WITH INTEGRATED SUBSTRATE TRANSFER MODULE

(75) Inventors: Shinichi Kurita, San Jose, CA (US); Emanuel Beer, San Jose, CA (US); Hung T. Nguyen, Fremont, CA (US); Benjamin Johnston, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/778,982

(22) Filed: Feb. 12, 2004

(51) Int. Cl.⁷ .......................................... G01R 31/305
(52) U.S. Cl. ...................................... 324/751; 324/758
(58) Field of Search ................................ 324/751, 754, 324/755, 757, 758, 765, 770; 250/310, 305, 306

(56) References Cited

U.S. PATENT DOCUMENTS

| | | |
|---|---|---|
| 3,983,401 A | 9/1976 | Livesay |
| 4,090,056 A | 5/1978 | Lockwood et al. |
| 4,437,044 A * | 3/1984 | Veith ........................ 315/366 |
| 4,495,966 A | 1/1985 | Longamore |
| 4,528,452 A | 7/1985 | Livesay |
| 4,725,736 A | 2/1988 | Crewe |
| 4,740,705 A | 4/1988 | Crewe |
| 4,760,567 A | 7/1988 | Crewe |
| 4,764,818 A | 8/1988 | Crew |
| 4,983,833 A | 1/1991 | Brunner et al. |
| 4,985,681 A | 1/1991 | Brunner et al. |
| 5,175,495 A | 12/1992 | Brahme et al. |
| 5,258,706 A | 11/1993 | Brunner et al. |
| 5,268,638 A | 12/1993 | Brunner et al. |
| 5,278,494 A | 1/1994 | Obigane |
| 5,369,359 A | 11/1994 | Schmitt |
| 5,371,459 A | 12/1994 | Brunner et al. |
| 5,414,374 A | 5/1995 | Brunner et al. |
| 5,558,717 A | 9/1996 | Zhao et al. |
| 5,801,764 A | 9/1998 | Koizumi et al. |
| 5,834,007 A | 11/1998 | Kubota |
| 5,834,773 A | 11/1998 | Brunner et al. |
| 6,086,362 A | 7/2000 | White et al. |
| 6,559,454 B1 | 5/2003 | Murrell et al. |
| 6,566,897 B2 | 5/2003 | Lo et al. |
| 6,730,906 B2 | 5/2004 | Brunner et al. |
| 6,765,203 B1 * | 7/2004 | Abel .......................... 250/310 |
| 2002/0034886 A1 | 3/2002 | Kurita et al. |

FOREIGN PATENT DOCUMENTS

| | | |
|---|---|---|
| EP | 0 370 276 B1 | 1/1994 |
| EP | 0 542 094 B1 | 1/1997 |
| EP | 0 932 182 A2 | 7/1999 |

* cited by examiner

*Primary Examiner*—David Zarneke
*Assistant Examiner*—Trung Q. Nguyen
(74) *Attorney, Agent, or Firm*—Moser, Patterson & Sheridan LLP

(57) ABSTRACT

A method and integrated system for electron beam testing a substrate is provided. In one aspect, the integrated system includes a transfer chamber having a substrate table disposed therein. The substrate table is capable of moving a substrate within the testing chamber in both horizontal and vertical directions. The substrate table includes a first stage moveable in a first dimension, a second stage moveable in a second dimension, and a third stage moveable in a third dimension. Each stage moves independently in its respective dimension. The system also includes a load lock chamber disposed adjacent a first side of the testing chamber, and a prober storage assembly disposed beneath the testing chamber. A prober stack assembly is disposed adjacent a second side of the testing chamber and arranged to transfer one or more probers between the prober storage assembly and the testing chamber. Further, one or more electron beam testing devices are disposed on an upper surface of the testing chamber.

30 Claims, 15 Drawing Sheets

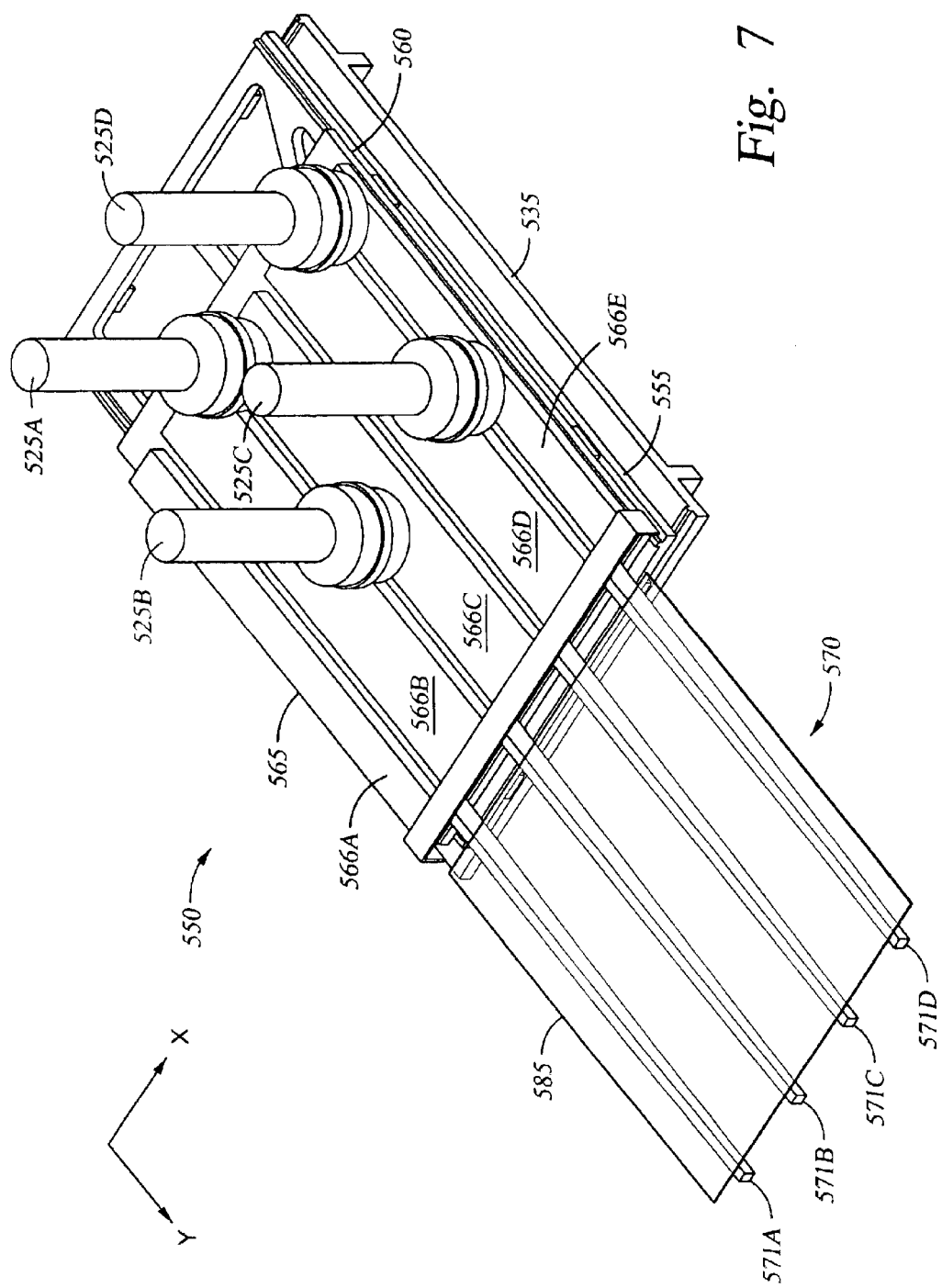

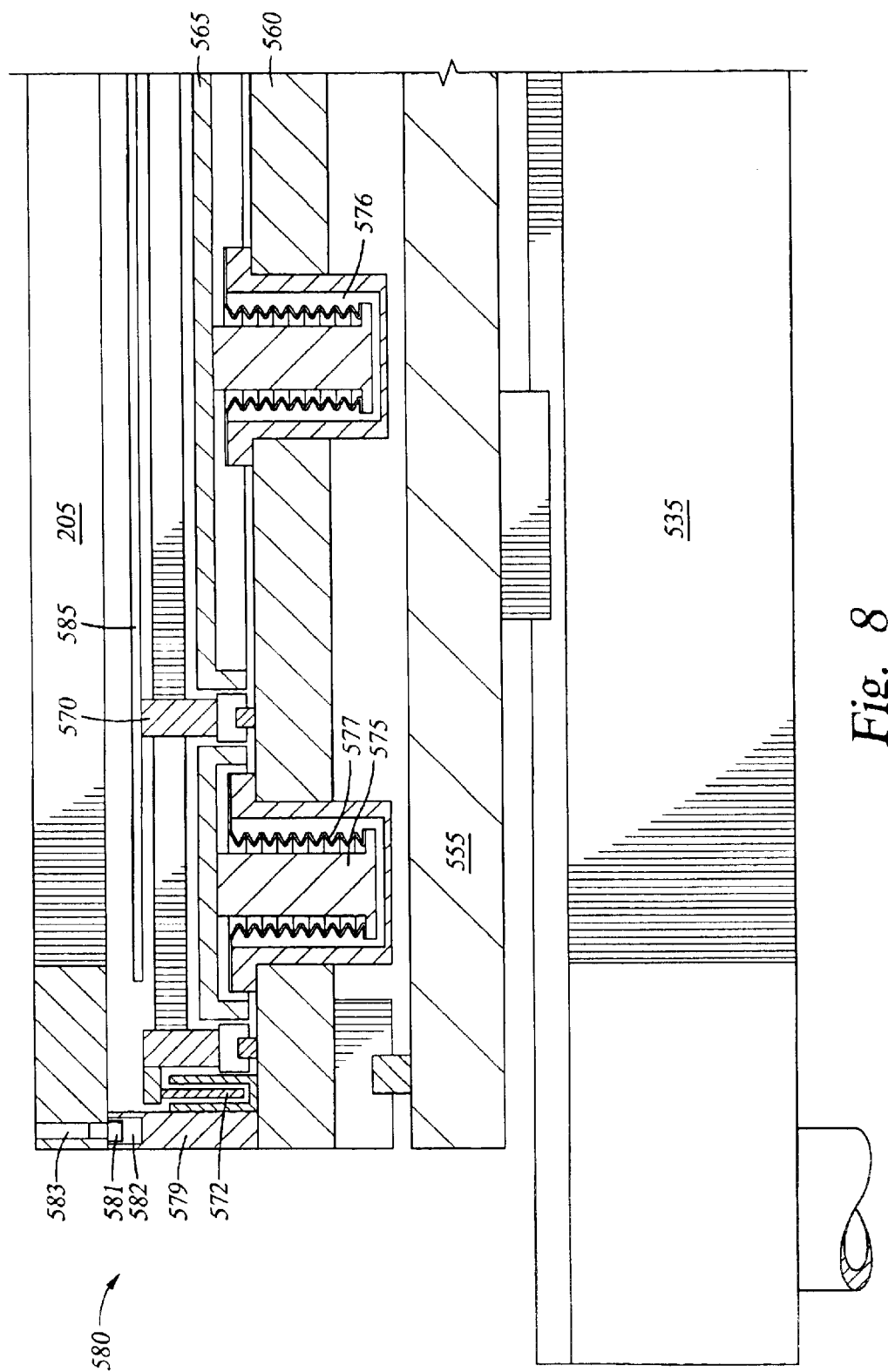

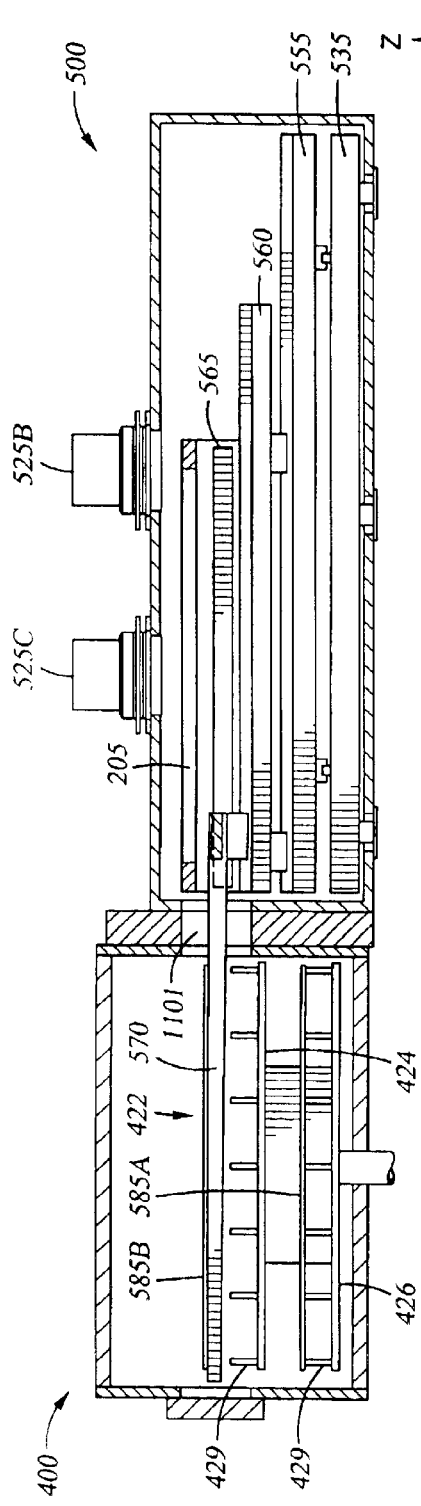
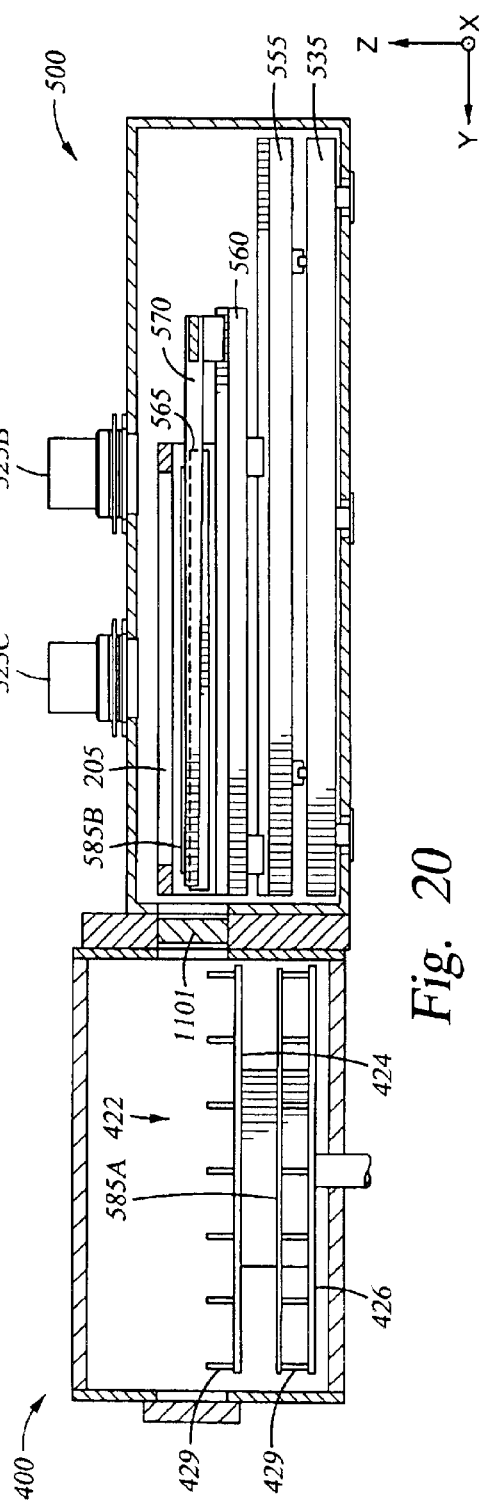

ELECTRON BEAM TEST SYSTEM WITH INTEGRATED SUBSTRATE TRANSFER MODULE

BACKGROUND OF THE INVENTION

1. Field of the Invention

Embodiments of the present invention generally relate to an integrated electron beam testing system for glass panel substrates.

2. Description of the Related Art

Active matrix liquid crystal displays (LCDs) are commonly used for applications such as computer and television monitors, cell phone displays, personal digital assistants (PDAs), and an increasing number of other devices. Generally, an active matrix LCD comprises two glass plates having a layer of liquid crystal materials sandwiched therebetween. One of the glass plates typically includes a conductive film disposed thereon. The other glass plate typically includes an array of thin film transistors (TFTS) coupled to an electrical power source. Each TFT may be switched on or off to generate an electrical field between a TFT and the conductive film. The electrical field changes the orientation of the liquid crystal material, creating a pattern on the LCD.

The demand for larger displays, increased production and lower manufacturing costs has created a need for new manufacturing systems that can accommodate larger substrate sizes. Current TFT LCD processing equipment is generally configured to accommodate substrates up to about 1.5×1.8 meters. However, processing equipment configured to accommodate substrate sizes up to and exceeding 1.9×2.2 meters is envisioned in the immediate future. Therefore, the size of the processing equipment as well as the process throughput time is a great concern to TFT LCD manufacturers, both from a financial standpoint and a design standpoint.

For quality control and profitability reasons, TFT LCD manufacturers are increasingly turning toward device testing to monitor and correct defects during processing. Electron beam testing (EBT) can be used to monitor and troubleshoot defects during the manufacturing process, thereby increasing yield and reducing manufacturing costs. In a typical EBT process, TFT response is monitored to provide defect information. For example, EBT can be used to sense TFT voltages in response to a voltage applied across the TFT. Alternatively, a TFT may be driven by an electron beam and the resulting voltage generated by the TFT may be measured.

During testing, each TFT is positioned under an electron beam. This is accomplished by positioning a substrate on a table positioned below the beam and moving the table to sequentially position each TFT on the substrate below the electron beam test device.

As flat panels increase in size, so does the table and associated equipment used for the testing. Larger equipment requires more space, i.e., a larger footprint per processing unit throughput, resulting in a higher cost of ownership. The large size of the equipment also increases the cost of shipping and may, in some cases, restrict the means and locales to which such equipment may be transported.

Therefore, there is a need for a compact testing system for flat panel displays that conserves clean room space and that can reliably position flat panels under an EBT device.

SUMMARY OF THE INVENTION

The present invention generally provides an integrated system for testing a substrate using an electron beam. In one aspect, the integrated system includes a transfer chamber having a substrate table disposed therein. The substrate table is capable of moving a substrate within the testing chamber in horizontal and vertical directions. The substrate table includes a first stage moveable in a first dimension, a second stage moveable in a second dimension, and a third stage moveable in a third dimension. Each stage moves independently in its respective dimension. The system further includes a load lock chamber disposed adjacent a first side of the testing chamber, and a prober storage assembly disposed beneath the testing chamber. A prober transfer assembly is disposed adjacent a second side of the testing chamber and arranged to transfer one or more probers between the prober storage assembly and the testing chamber. Further, one or more electron beam testing devices are disposed on an upper surface of the testing chamber.

In another aspect, the integrated electron beam testing system includes a substrate table comprising a first stage moveable horizontally along a X axis, a second stage moveable horizontally along a Y axis, and a third stage moveable vertically along a Z axis. The integrated electron beam testing system also includes a load lock chamber disposed adjacent a first side of the testing chamber, a prober storage assembly disposed beneath the testing chamber, a prober transfer assembly disposed adjacent a second side of the testing chamber, and one or more electron beam testing devices disposed on an upper surface of the testing chamber.

The present invention also provides a method for electron beam testing a substrate within an integrated electron beam test assembly. In one aspect, a substrate to be tested is loaded into a testing chamber having a substrate table disposed therein. The substrate table is capable of moving the substrate within the testing chamber in horizontal and vertical directions. The substrate table comprises a first stage moveable in a first dimension, a second stage moveable in a second dimension, and a third stage moveable in a third dimension, wherein each stage moves independently in its respective dimension. Once the substrate to be tested is loaded in the testing chamber, the third stage elevates to position the substrate in a testing position, and electron beams are transmitted from one or more electron beam testing devices disposed on an upper surface of the testing chamber to test the substrate. The first and second stages move in an X or Y dimension to position discrete portions of the substrate beneath the one or more electron beam testing devices. After testing is complete, the third stage is lowered to transfer the tested substrate on an upper surface of an end effector disposed on the second stage. The end effector having the tested substrate disposed thereon then extends into a load lock chamber disposed adjacent a first side of the testing chamber, and transfers the tested substrate to the load lock chamber. The the end effector then retracts to the testing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7 is a schematic plan view of one embodiment of an end effector shown in an extended position from the substrate table.

FIG. 8 is an enlarged partial cross section view of the testing chamber shown in FIG. 5.

FIGS. 11–20 are partial cross section views of the embodiment of the load lock chamber and the testing chamber illustrating the sequence of operation of a transfer module disposed within the testing chamber.

DETAILED DESCRIPTION OF THE PREFERRED EMBODIMENT

Figure 1:
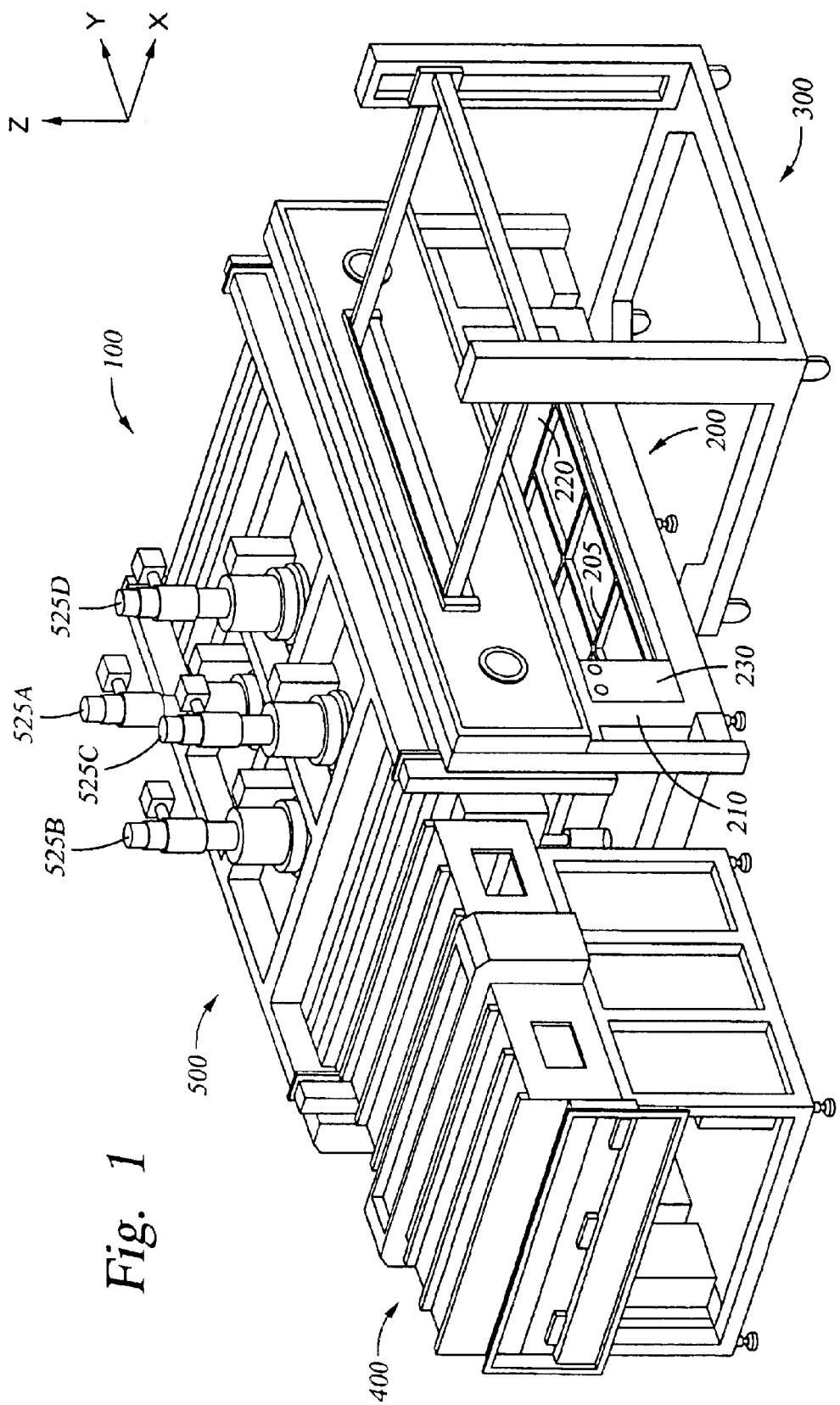
FIG. 1 is a schematic view of one embodiment of an integrated electron beam test assembly as described herein.

FIG. 1 shows a schematic view of an electron beam test system 100. The electron beam test system 100 is an integrated system requiring minimum space, and is capable of testing large glass panel substrates, up to and exceeding 1.9 meters by 2.2 meters. As will be described below, the electron beam test system 100 provides stable substrate handling, reduces both substrate and prober alignment time, reduces unwanted particle generation, and provides improved test accuracy, reliability and repeatability.

Referring to FIG. 1, the electron beam test system 100 includes a prober storage assembly 200, a prober transfer assembly 300, a load lock chamber 400, and a testing chamber 500. The prober storage assembly 200 houses one or more probers 205 proximal the test chamber 500 for easy use and retrieval. Preferably, the prober storage assembly 200 is disposed beneath the test chamber 500 as shown in FIG. 1, reducing the clean room space needed for a contaminant free and efficient operation. The prober storage assembly 200 preferably has dimensions approximating those of the testing chamber 500 and is disposed on a mainframe 210 supporting the testing chamber 500. The prober storage assembly 200 includes a shelf 220 disposed about the mainframe 210 to provide a support for the one of more probers 205. The prober storage assembly 200 may further include a retractable door 230 that can seal off the storage area and protect the stored probers 205 when not in use.

Figure 2:
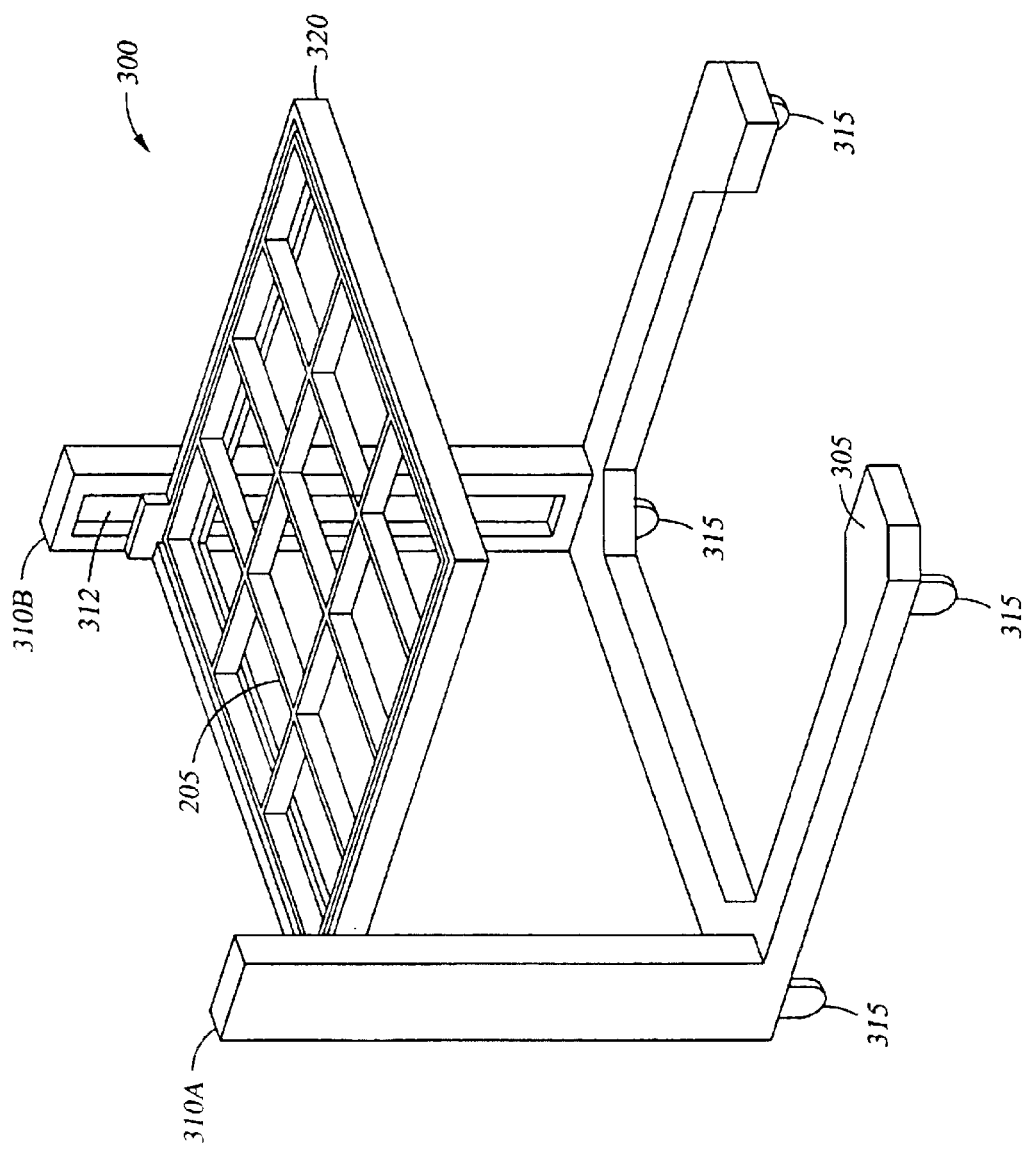
FIG. 2 is a schematic plan view of one embodiment of a prober transfer assembly.

FIG. 2 shows a schematic plan view of the prober transfer assembly 300. The prober transfer assembly 300 is a modular unit disposable near the testing chamber 500 for transferring a prober 205 between the prober storage assembly 200 and the test chamber 500. The prober transfer assembly 300 includes a base 305 connected to two or more vertical support members 310A, 310B (two are shown). Wheels or casters 315 may be arranged on a bottom surface of the base 305 to easily maneuver the assembly 300 when desired.

The prober transfer assembly 300 further includes a lift arm 320 that is attached at one end thereof to the support members 310A, 310B. The support members 310A, 310B each include a recessed track 312 (one is shown in this view) for mating engagement with the lift arm 320. The recessed tracks 312, one or both, may house a linear actuator, a pneumatic cylinder, a hydraulic cylinder, a magnetic drive, a stepper or servo motor, or other type of motion device (not shown). The recessed tracks 312 working in conjunction with the motion device (not shown) guide and facilitate the vertical movement of the lift arm 320. A second motion device (not shown) or pair of motion devices (also not shown) may be coupled to the lift arm 320 to move the lift arm 320 in a horizontal direction. This horizontal movement facilitates the insertion of the lift arm 320 having the prober 205 disposed thereon within the testing chamber 500 or within the storage assembly 200 to deliver the prober 205, as explained in more detail below. Likewise, the horizontal movement of the lift 320 facilitates the retrieval of a prober 205 from the testing chamber 500 or from the storage assembly 200. These above mentioned horizontally and vertically actuated motors may be combined into a single motor capable of moving the lift arm 320 in both directions. Such a combined motor may be located in one or both of the recessed tracks 312 or coupled to the lift arm 312.

In operation, the lift arm 320 supports the prober 205 on an upper surface, thereof, and is raised or lowered by the linear motors (not shown) disposed within the recessed tracks 312 to align the prober 205 at the elevation of the testing chamber 500 or the storage assembly 200. The lift arm 320 is then extended or retracted by the horizontal linear motor to transfer the prober 205 in or out of the testing chamber 500 or storage assembly 200.

Referring again to FIG. 1, the load lock chamber 400 is disposed adjacent and connected to the testing chamber 500. These chambers 400, 500 share a common environment which is typically maintained at vacuum conditions by a pump (not shown) coupled through the testing chamber 500. The load lock chamber 400 transfers substrates between the transfer chamber 500 and the outside which is typically a clean room at atmospheric pressure. The load lock chamber 400 may function as an isolated processing environment that is capable of being heated or cooled as well as pressurized or de-pressurized, depending on system requirements. Consequently, load lock chamber 400 enables the transfer of substrates into and out of the testing chamber 500 without exposure to outside contaminants.

Figure 3:
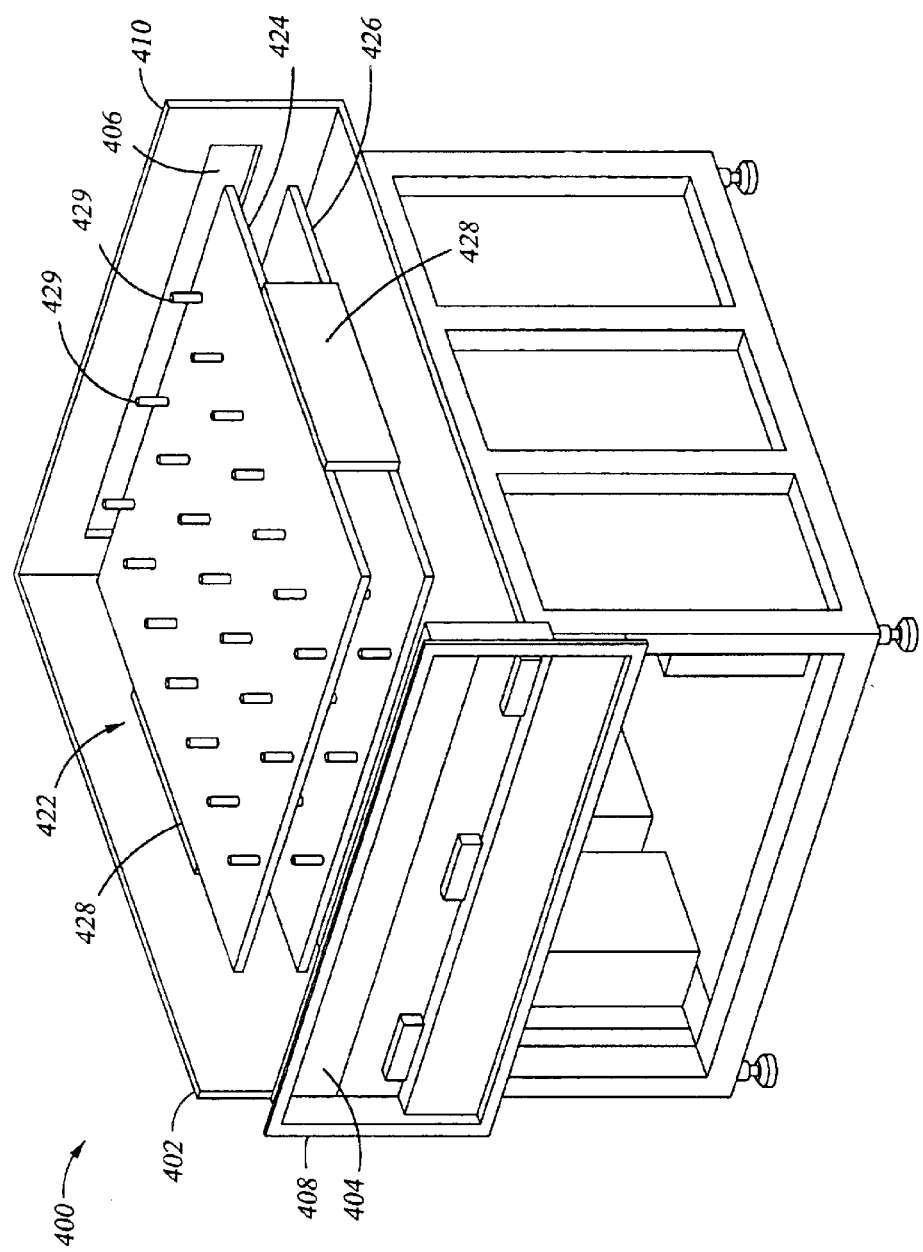
FIG. 3 is an enlarged schematic view of one embodiment of a load lock chamber.

FIG. 3 shows an enlarged schematic view of one embodiment of a load lock chamber 400 having a dual slot substrate support. The load lock chamber 400 includes a chamber body 402 and a dual slot substrate support 422 disposed therein. The chamber body 402 includes at least a first sealable port 404 and a second sealable port 406 formed through sidewalls 408, 410 thereof as shown. Each port 404, 406 is selectively sealable by a slit valve (not shown) to isolate an interior environment of the chamber body 402. The first port 404 typically couples the load lock chamber 400 to a factory interface (substrate queuing system), a processing system or other device (not shown). The second port 406 is typically disposed between the load lock chamber 400 and the testing chamber 500 to facilitate substrate transfer therebetween.

A pumping system (not shown), coupled to the load lock chamber 400 through a pumping port (also not shown for simplicity purposes), allows pressure within the load lock chamber 400 to be decreased or increased to a level substantially equal to that of the pressure within the testing chamber 500. A vent (not shown), having a flow control valve (not shown) in communication therewith, is formed through the chamber body 402 of the load lock chamber 400. The control valve may be selectively opened to deliver filtered gas into the load lock chamber 400, thereby raising or lowering the pressure within the load lock chamber 400 to a level substantially equal to the pressure in the device (not shown) coupled to the load lock chamber 400 through the first port 406.

The dual slot support 422 is disposed on a shaft (not shown) connected to a lift mechanism (also not shown). The lift mechanism allows the dual slot support 422 to move vertically within the chamber body 402 to facilitate substrate transfer to and from the load lock chamber 400. The dual slot support 422 includes a first substrate support tray 424 and a second substrate support tray 426 that are maintained in a stacked, spaced-apart relationship by a pair of vertical supports 428.

The load lock chamber 400 may include a heater and/or cooler disposed therein to control the temperature of the substrates positioned within the load lock chamber 400. For example, one or more heating plates and one or cooling plates (not shown) may be attached to the substrate support trays 424, 426. Also for example, a heat exchanger (not shown) may be disposed within the sidewalls of the chamber body 402. Alternatively, a non-reactive gas, such as nitrogen for example, may be passed through the load lock chamber 400 to transfer heat in and out of the chamber 400.

Each tray 424, 426 is configured to support a substrate thereon (not shown). Typically, one or more support pins 429 are coupled to an upper surface of each substrate support tray 424, 426 or at least partially disposed therethrough to support a substrate. The support pins 429 may be of any height, and provide a predetermined spacing or gap between a lower surface of the substrate and the upper surface of the substrate support tray 424 or 426. The gap prevents direct contact between the substrate support trays 424, 426 and the substrates, which might damage the substrates or result in contaminants being transferred from the substrate support trays 424, 426 to the substrates.

In one aspect, the support pins 429 have a rounded upper portion that contacts a substrate disposed thereon. The rounded surface reduces surface area in contact with the substrate thereby reducing the chances of breaking or chipping the substrate disposed thereon. In one embodiment, the rounded surface resembles a hemispherical, ellipsoidal, or parabolic shape. The rounded surface may have either a machined or polished finish or other suitable finish of adequate smoothness. In a preferred embodiment, the rounded surface has a surface roughness no greater than 4 micro inches. In another aspect, the rounded upper portion of the support pin 429 is coated with a chemically inert material to reduce or eliminate chemical reactions between the support pin 429 and the substrate supported thereon. Additionally, the coating material may minimize friction with the substrate to reduce breakage or chipping. Suitable coatings include nitride materials, such as silicon nitride, titanium nitride, and tantalum nitride, for example. A more detailed description of such support pins and coatings may be found in U.S. Pat. No. 6,528,767, which is incorporated by reference herein.

In another aspect, the support pins 429 may be a two piece system comprising a mounting pin disposed on an upper surface of the support tray 422, 426, and a cap disposable on the mounting pin. The mounting pin is preferably made of a ceramic material. The cap includes a hollow body to receive the mounting pin. The upper portion of the cap may be rounded and smoothed as discussed above. Similarly, the cap may be coated as described above. A more detailed description of such a two piece system may also be found in U.S. Pat. No. 6,528,767, which is incorporated by reference herein.

In yet another aspect, an upper portion of the support pins 429 may include a socket that retains a ball moveable within the socket. The ball makes contact with and supports the substrate disposed thereon. The ball is allowed to rotate and spin, much like a ball bearing, within the socket allowing the substrate to move across the ball without scratching. The ball is generally constructed of either metallic or nonmetallic materials that provide friction reduction and/or inhibit chemical reaction between the ball and the substrate. For example, the ball may include a metal or metal alloy, quartz, sapphire, silicon nitride or other suitable non-metallic materials. Preferably, the ball has a surface finish of 4 micro-inches or smoother. The ball may further include the coating describe above. A more detailed description of such a support pin may be found in U.S. Pat. No. 6,528,767, which is incorporated by reference herein.

Alternatively, the support pins 429 may be a two piece system comprising a mounting pin disposed on an upper surface of the support tray 422 or 426, and a cap disposable on the mounting pin, whereby the cap includes the socket and ball configuration described above. A more detailed description of such a ball and socket may be found in co-pending U.S. patent application Ser. No. 09/982,406, as well as serial no 10/376,857, both entitled "Substrate Supporrt", and both assigned to Applied Materials. Inc. Both co-pending applications are incorporated by reference herein.

Further, the support pins 429 may include a housing having one or more roller assemblies and a support shaft at least partially disposed therein. The support shaft is able to move axially through the housing as well as rotate within the housing to reduce wear and tear on the pin head during loading and unloading of a substrate supported thereon. The support pins 429 may also include a housing having one or more ball assemblies and a support shaft at least partially disposed therein. The ball assemblies include one or more spherical members that are held into place by a sleeve that is at least partially disposed about the housing. The one or more spherical members contact the shaft and allow the shaft to move axially as well as radially within the housing. This also reduces wear and tear on the pin head during loading and unloading of a substrate supported thereon. A more detailed description of such support pins may be found in commonly assigned and copending U.S. patent application, Ser. No. 10/779,130 entitled "Support Bushing for Flat Panel Substrates," which is incorporated by reference herein.

Figure 4:
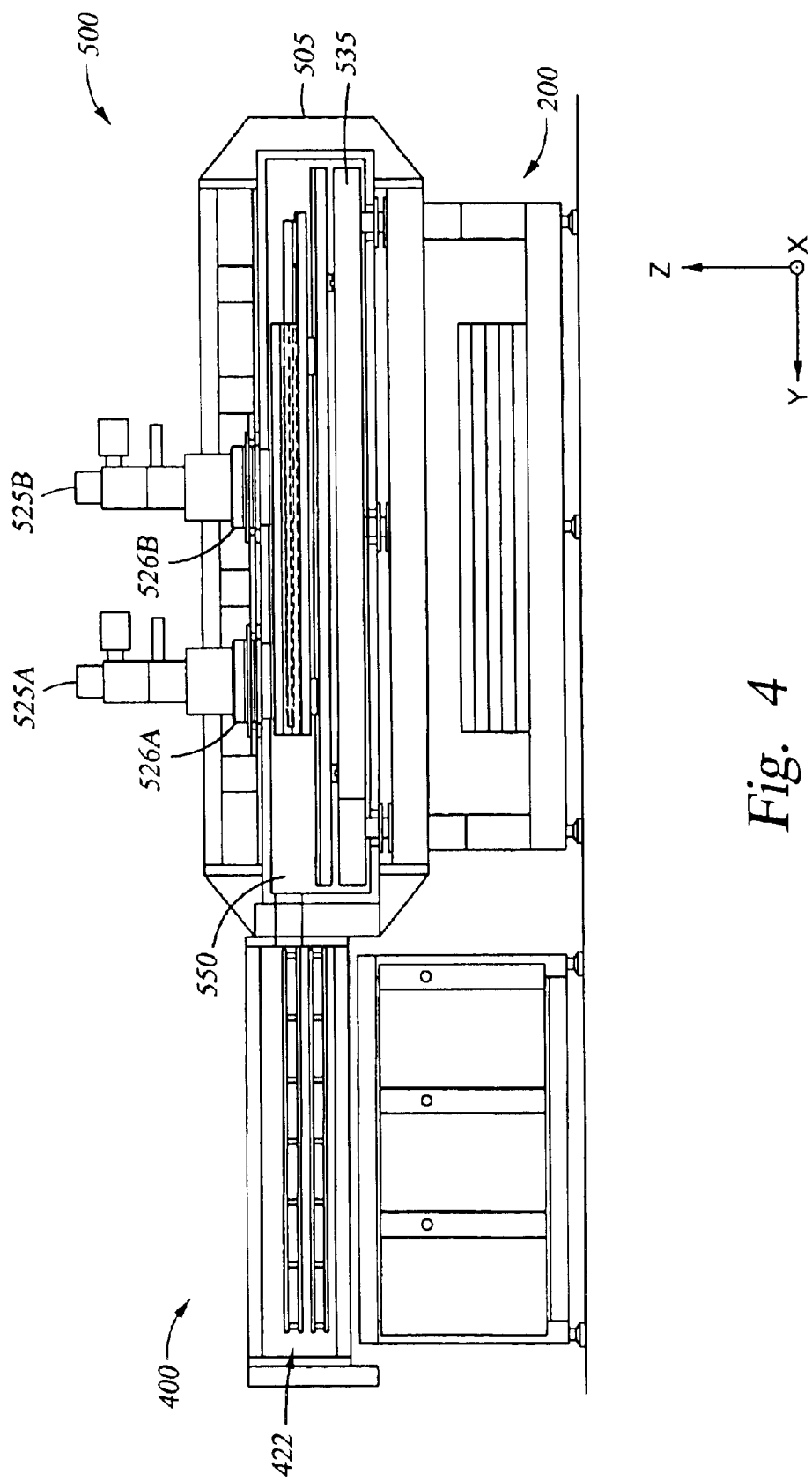
FIG. 4 is a partial cross section view of the load lock chamber and the testing chamber.

FIG. 4 shows a partial cross section view of the load lock chamber 400 and the testing chamber 500. The testing chamber 500 includes a housing 505, one or more electron beam testing (EBT) columns 525A/B (two are shown in this view), a base 535, and a substrate table 550. Four EBT columns 525 A, B, C, D are shown in FIG. 1. The EBT columns 525A/B/C/D are disposed on an upper surface of the housing 505 and are coupled to the housing 505 via a port 526A/B formed through the upper surface thereof. The housing 505 provides a particle free environment and encloses the substrate table 550 and the base 535. The base 535 is fixed at the bottom of the housing 505 and supports the substrate table 550.

Figure 5:
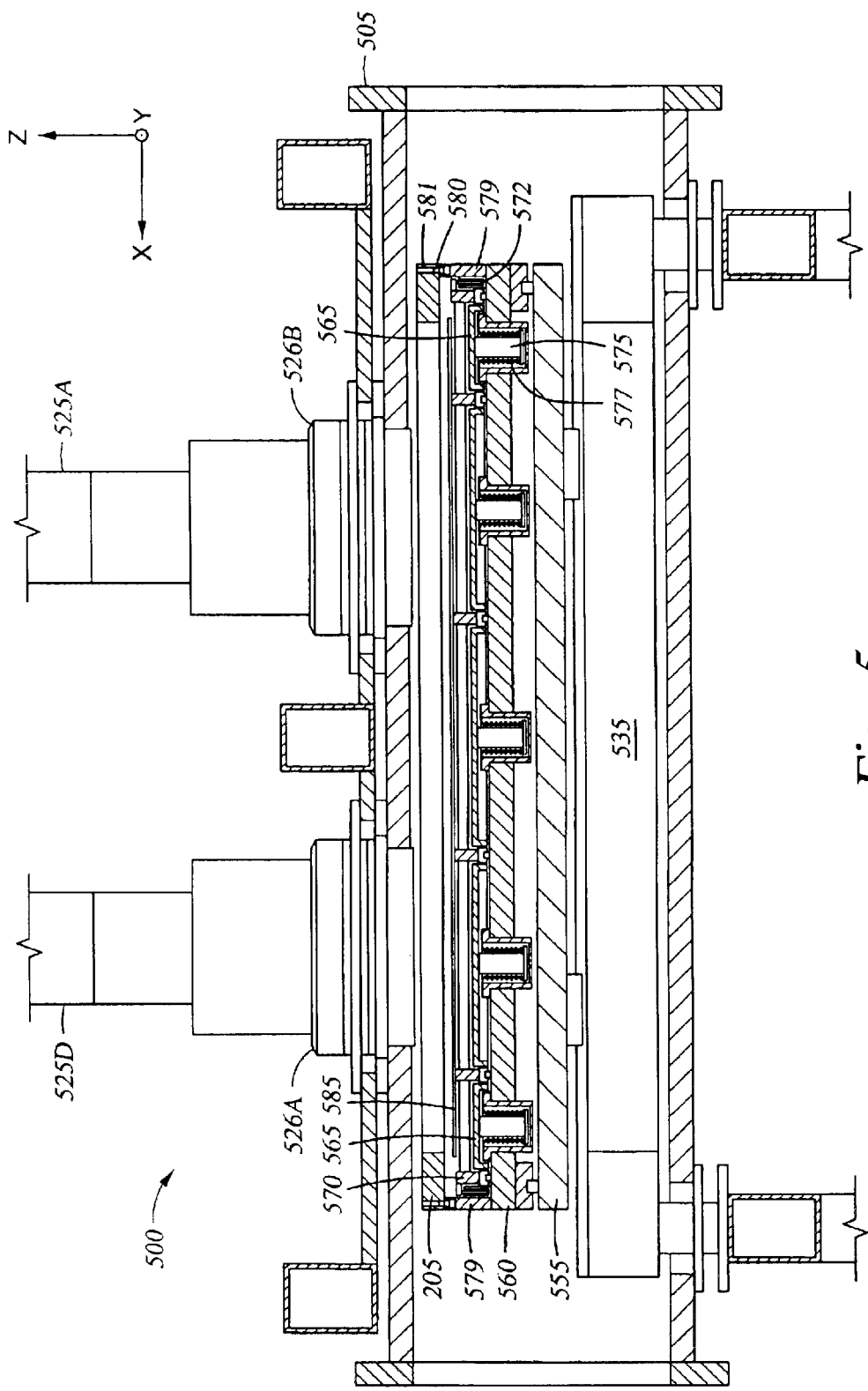
FIG. 5 is an enlarged cross section view of the embodiment of the testing chamber shown in FIG. 4.

Considering the substrate table 550 in more detail, FIG. 5 shows an enlarged cross section view of the testing chamber 500 shown in FIG. 4. The substrate table 550 includes a first stage 555, a second stage 560, and third stage 565. The three stages 555, 560, and 565 are planar monoliths or substantially planar monoliths, and are stacked on one another. In one aspect, each of the three stages 555, 560, 565 independently move along orthogonal axes or dimensions. For simplicity and ease of description, the first stage 555 will be further described below as representing the stage that moves along the X-axis and will be referred to as the lower stage 555. The second stage 560 will be further described below as representing the stage that moves along the Y-axis and will be referred to as the upper stage 560. The third stage 565 will be further described below as representing the stage that moves along the Z-axis and will be referred to as the Z-stage 565.

The lower stage 555 and the upper stage 560 each may move side to side or forward and backward, depending on the orientation of the testing chamber 500. In other words, the lower stage 555 and the upper stage 560 both move linearly on the same horizontal plane, but move in a direction orthogonal to one another. In contrast, the Z-stage 565 moves in a vertical direction or the "Z direction." For example, the lower stage 555 moves side to side in the "X direction", the upper stage 560 moves forward and backward in the "Y direction and the Z-stage 565 moves up and down in the "Z direction."

The lower stage 555 is coupled to the base 535 through a first drive system (not shown in this view). The first drive system moves the lower stage 555 linearly along the X axis. Similarly, the upper stage 560 is coupled to the lower stage 555 through a second drive system, (not shown in this view) which moves the upper stage 560 linearly along the Y axis. The first drive system is capable of moving the substrate table 550 in the X direction or dimension by at least 50 percent of the width of the substrate. Likewise, the second drive system is capable of moving the substrate table 550 in the Y direction or dimension by at least 50 percent of the length of the substrate.

Figure 6B:
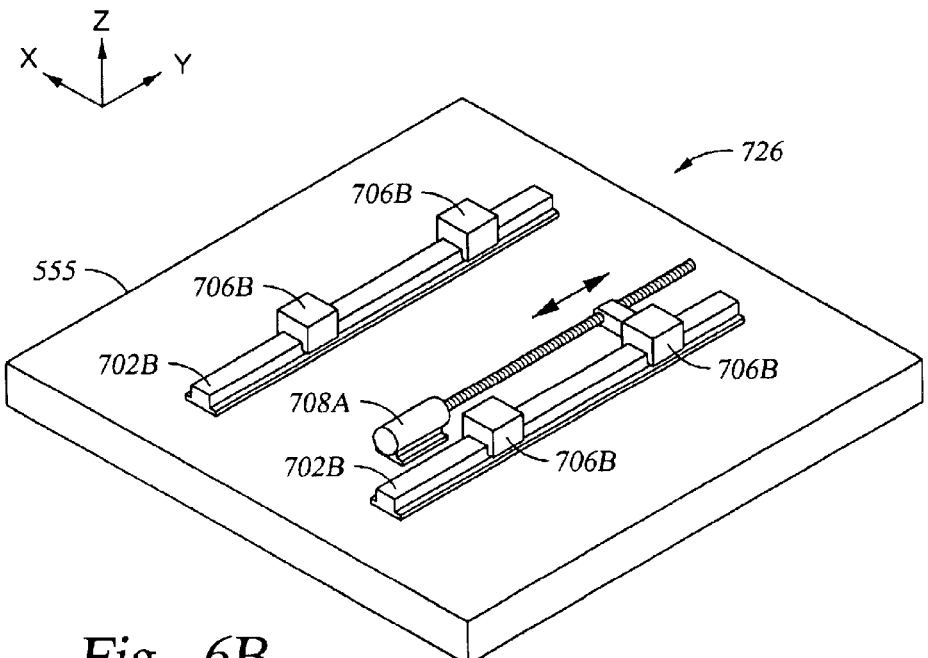
FIGS. 6A and 6B are enlarged schematic views of the drive systems according to one embodiment described herein.
Figure 6A:
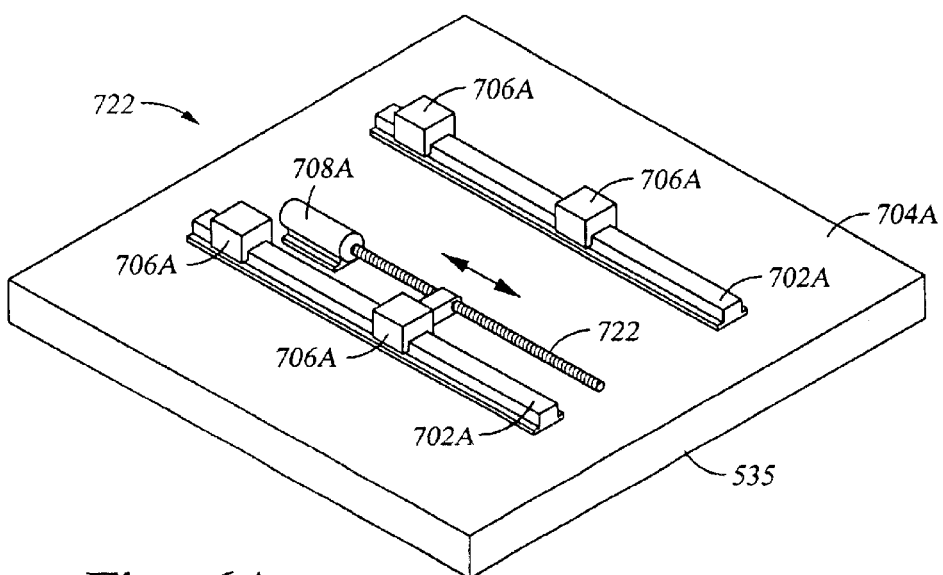

FIGS. 6A and 6B show an enlarged schematic view of these drive systems. Referring to FIG. 6A, the first drive system 722 generally includes a pair of linear rails 702A coupled to the base 535. A plurality of guides 706A are movably engaged with the rails 702A and are coupled to a first side 704A of the lower stage 555 (not shown in this view). The guides 706A move along the rails 702A, thereby allowing the lower stage 555 to move over the base 535 in a first direction, i.e., along the X-axis. Linear motor 708A, such as a ball screw and motor, is coupled between the lower stage 555 and the base 535 to control the position of the guides 706A. The lower stage 555 is coupled to each of the guides 706A, allowing the lower stage 555 to move in response to the actuator 708A. In addition to linear actuators, other types of motion devices may be used as well, such as a pneumatic cylinder, a hydraulic cylinder, a magnetic drive, or a stepper or servo motor, for example.

Referring to FIG. 6B, the upper stage 560 is coupled to the lower stage 555 via the second drive system 726. The second drive system 726 is configured similar to the first drive system 722 except the second drive system 726 is oriented in a direction orthogonal to the first drive system 722. Similar to the lower stage 555 above, a lower surface of the upper stage 560 is coupled to each of the guides 706B, allowing the upper stage 560 to move in response to the linear motor 708B. Generally, the drive systems 722, 726 have a range of motion that allows all of the surface area of a substrate disposed within the testing chamber 500 to be moved beneath the EBT columns 525 during testing.

Referring back to FIG. 5, the testing chamber 500 further includes an end effector 570 to transfer a substrate 585 in and out of the testing chamber 500. In operation, the end effector 570 may be extended from the testing chamber 500 into the load lock chamber 400 to load a substrate. Likewise, the end effector 570 having a substrate loaded thereon may be extended from the testing chamber 500 into the load lock chamber 400 to transfer the substrate to the load lock chamber 400. A motion device, such as a linear actuator, a pneumatic cylinder, a hydraulic cylinder, a magnetic drive, or a stepper or servo motor, for example may be coupled to the end effector 570 to assist this transfer. In one aspect, the end effector 570 includes a pair of bearing blocks 572 that permit the end effector 570 to move in and out of the testing chamber 500.

The end effector 570 has a planar or substantially planar upper surface on which the substrate 585 may be supported. In one embodiment, the end effector 570 is a slotted monolith that rests on an upper surface of the upper stage 560. FIG. 5 shows one embodiment of the end effector 570 having four fingers that are evenly spaced, which contact and support the substrate 585 when placed thereon. The actual number of fingers is a matter of design and is well within the skill of one in the art to determine the appropriate number of fingers needed for the size of substrate to be manipulated.

The Z-stage 565 is disposed on an upper surface of the upper stage 560. The Z-stage 565 has a planar or substantially planar upper surface to contact and support the substrate 585 within the testing chamber 500. The Z-stage 565 is slotted or segmented such that each segment of the Z-stage 565 sits adjacent the fingers of the end effector 570. As such the Z-stage 565 and the end effector 570 can be interdigitated on the same horizontal plane. This configuration allows the Z-stage 565 to move above and below the end effector 570. Accordingly, the spacing between the segments of the Z-stage 565 corresponds to the width of the fingers of the end effector 570 plus some additional measure to assure clearance. Although five segments are shown in the cross section view of FIG. 5, the Z-stage may have any number of segments.

Still referring to FIG. 5, one or more Z-stage lifts 575 is coupled to the back side of each of the segments making up the Z-stage 565. Each Z-stage lift 575 is disposed within a channel 576 formed in the upper stage 560, and a bellows 577 is arranged about each Z-stage lift 575 to reduce particle contamination within the testing chamber 500. The Z-stage lift 575 moves up and down vertically and may be actuated pneumatically or electrically. The bellows 577 compress and expand in response to the movement of the lift 575.

FIG. 7 shows a schematic plan view of the end effector 570 shown in an extended position from the substrate table 550. The end effector 570 extends from the testing chamber 500 (not shown) to the load lock chamber 400 (not shown) to transfer substrates therebetween. The sequence of which is described in more detail below. As shown in FIG. 7, the end effector includes four fingers 571A–D that have extended away from the five segments 566A–E of the Z-stage 565. The substrate 585 is disposed on and supported by the fingers 571A–D. The fingers 571A–D move in and out of the Z-stage 565 such that the fingers 571A–D interdigitate with the segments 566A–E when the end effector 570 is disposed in substantially the same plane as the Z-stage 565. This configuration allows the end effector 570 to freely extend and retract. As will be described below, the Z-stage 565 is capable of elevating above the end effector 570 to load and un-load the substrate 585 between the end effector 570 and the Z-stage 565.

FIG. 8 shows an enlarged partial cross section view of the testing chamber 500 shown in FIG. 5. The Z-stage lift 575 is activated to move the Z-stage 565 vertically up and down. As shown, the Z-stage 565 is in a lowered or "substrate transfer" position. In this position, the substrate 585 rests on the upper surfaces of the fingers of the end effector 570, and does not contact the lower surface of the prober 205. Also, the lift 575 is located at the bottom of the channel 576 and the bellows 577 are extended.

Still referring to FIG. 8, as shown, the prober 205 rests on a collar 579 disposed on an upper surface of the upper stage 560 and is secured to the collar 579 using a pin assembly 580. The pin assembly 580 may include a spring loaded pin 581 disposed within a recess 582 formed in the collar 579. The pin 581 extends into a matching receptacle 583 machined into the perimeter of the prober 205, securing the prober 205 to the upper stage 560.

Figure 9:
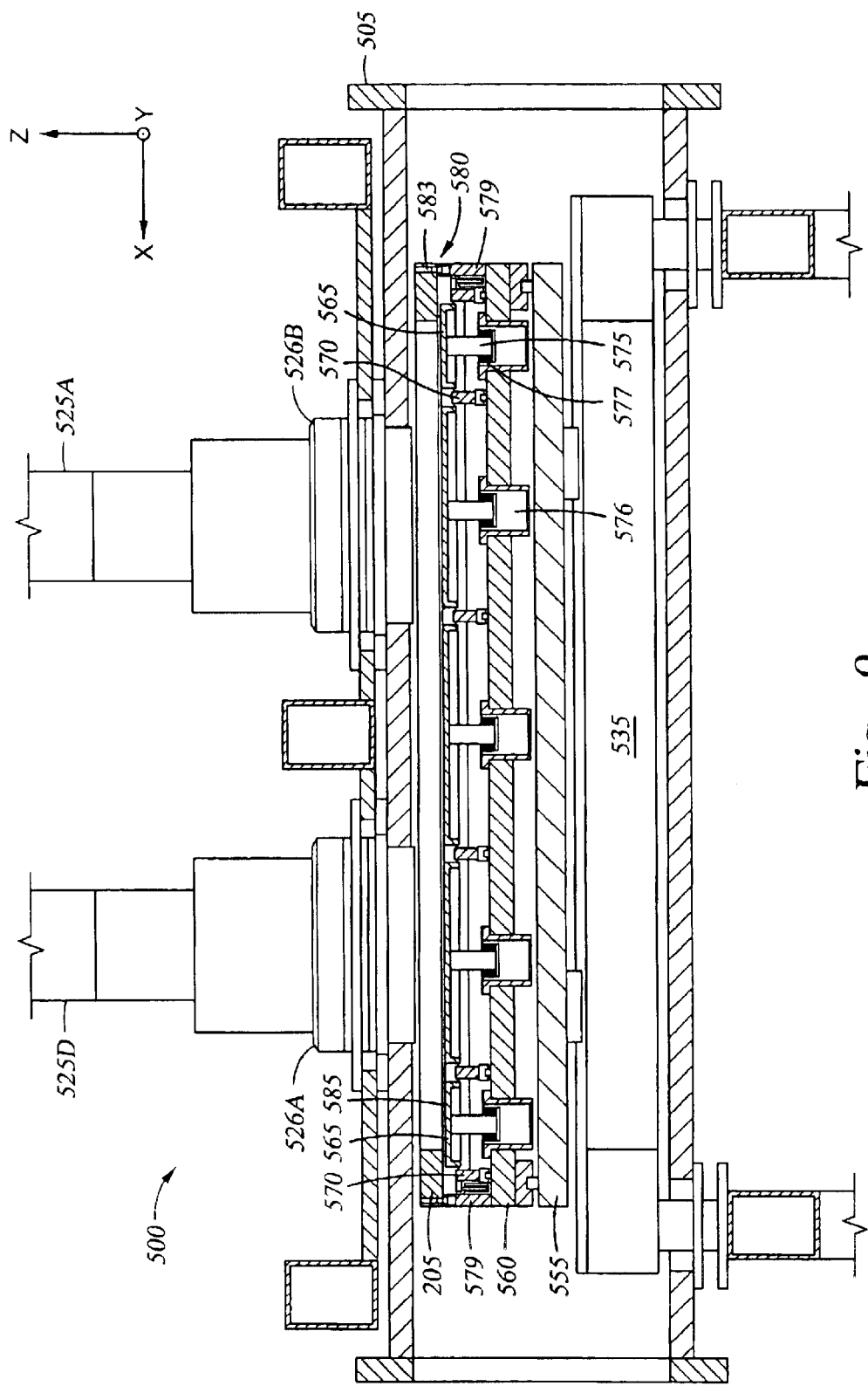
FIG. 9 is another enlarged cross section view of the testing chamber of FIG. 5.

FIG. 9 shows another enlarged cross section view of the testing chamber 500. In this view, the Z-stage 565 is shown in a raised or "substrate testing" position. In the testing position, the Z-stage lift 575 is activated, moving the Z-stage 565 vertically upward in the "Z direction." The Z-stage 565 travels upward, traversing the fingers of the end effector 570 and lifting the substrate 585 off the end effector 570. The Z-stage 565 continues to move upward until the substrate 585 sits against the backside of the prober 205 to make an electrical connection between the prober 205 and the substrate 585. This allows the prober 205 to directly contact the substrate 585 and facilitate the electron beam test methods as described below. As shown in FIG. 9, the Z-stage lifts 575 have moved to an upward portion of the channel 576, and the bellows 577 are compressed.

Figure 10:
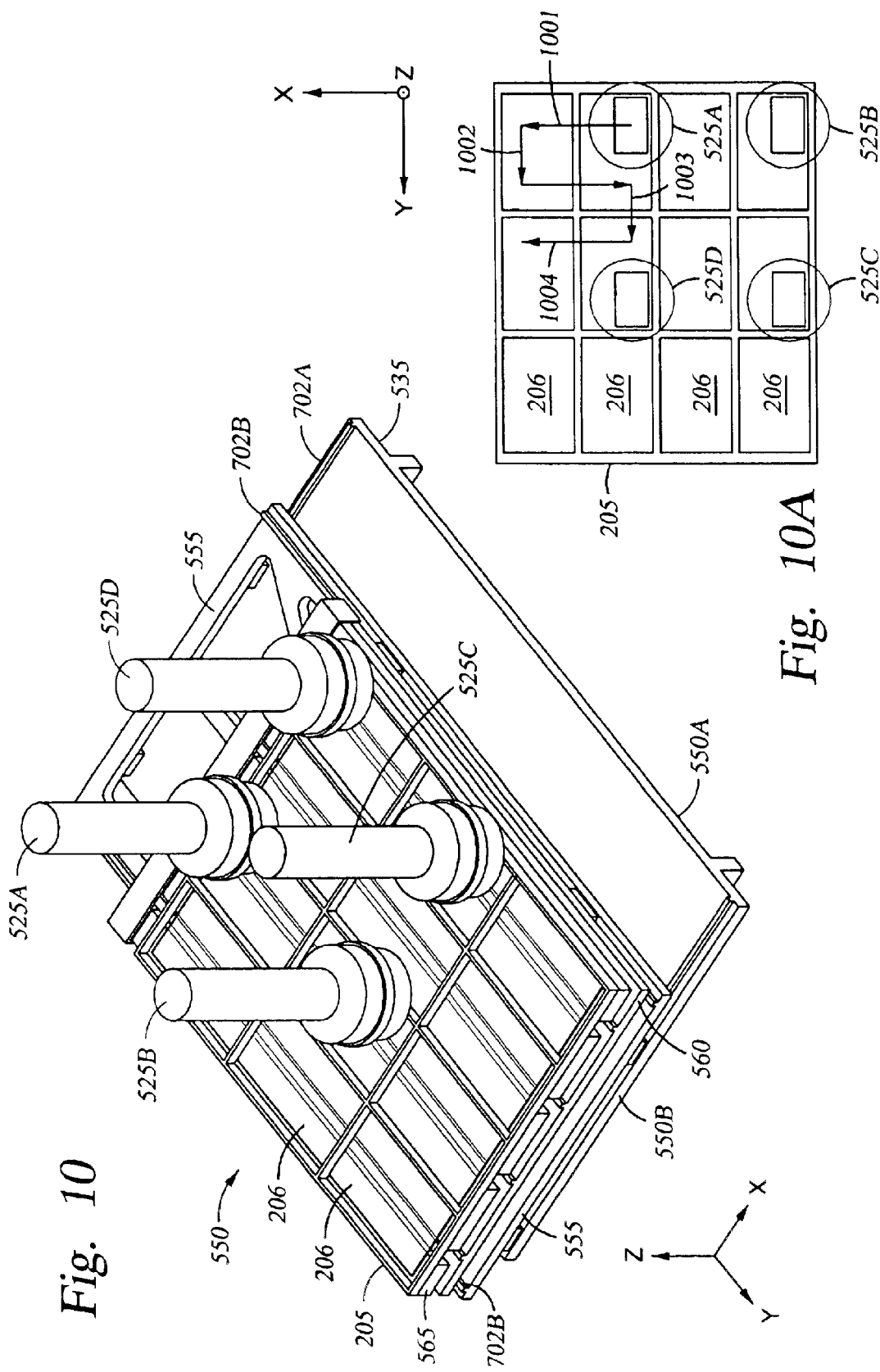
FIG. 10 is a basic schematic plan view of the embodiment of the transfer module as it is shown in cross section in FIG. 9.

For further understanding, FIG. 10 shows a basic schematic plan view of the substrate table 550 as it is shown in cross section in FIG. 9. The housing 505 has been removed to more easily visualize the components of the substrate table 550 in relation to the EBT testing columns 525A–D. The substrate table 550 is shown such that side 550A would be adjacent the prober transfer assembly 300 disposed toward the X direction and the side 550B would be adjacent the load lock chamber 400 disposed toward the Y direction.

As shown in this perspective, the lower stage 555 is disposed on the base 535 and moves along rails 702A. The upper stage 560 is disposed on the lower stage 555 and moves along rails 702B. The Z-stage 565 is disposed on the upper stage 560 and the end effector 570 (not shown) is disposed therebetween. The substrate 585 is resting on the upper surface of the Z-stage 565 and abuts the lower surface of the prober 205.

In operation, the substrate table 550 positions the substrate 585 and the prober 205 so that the columns 525A–D may interact with discrete portions of the substrate 585. Each column 525A–D is an electron beam generator that detects voltage levels of the devices formed on the substrate 585.

The prober 205 generally has a picture frame configuration, having sides at least partially defining at least one window or display 206 through which the columns 525A–D interact with the substrate 585. Each window 206 is positioned to allow a predefined field of pixels (or other device) formed on the substrate 585 to be exposed to the electron beam generated by the columns 525A–D. Accordingly, the number, size and positions of the windows 206 in a particular prober 205 are chosen based upon the layout of the substrate 585 and the devices on the substrate 585 to be tested.

A face of the prober 205 contacting the substrate 585 generally includes a plurality of electrical contact pads that are coupled to a controller (not shown). The electrical contact pads are positioned to provide electrical connection between a predetermined pixel (or other device formed on the substrate 585) and the controller. Thus, as the substrate 585 is urged against the prober 205, electrical contact between the controller and the devices on the substrate 585 are made through the contact pads on the prober 205. This allows the controller to apply a voltage to a selected pixel or to monitor each pixel for changes in attributes, such as voltage, during testing.

In one embodiment, the substrate is tested by sequentially impinging at least one electron beam emitted from the columns 525A–D on discrete portions or pixels composing the thin film transistor matrix. After a pixel is tested, the substrate table 550 moves the substrate 585 to another discrete position within the testing chamber 500 so that another pixel on the substrate 585 surface may be tested.

FIG. 10A shows an exemplary testing pattern showing twelve different test locations. The discrete portions of the substrate surface under each column 525A–D represents one test location. As shown, the substrate 585 is moved along the X-axis as shown by arrow 1001 and tested in four locations under columns 525A, 525B, 525C, and 525D. The substrate 585 is then moved along the Y-axis as shown by arrow 1002 and tested in four different locations. The substrate 585 is then moved and tested as shown by arrows 1003 and 1004 until the entire surface of the substrate 585 or the desired portions of the substrate surface have been tested using the desired electron beam test method.

Electron beam testing may employ several test methods. For example, the electron beam may be utilized to sense pixel voltages in response to the voltage applied across the pixels or the pixel through the electrical connections in the prober 205. Alternatively, a pixel or a plurality of pixels may be driven by the electron beam which provides a current to charge up the pixel(s). The pixel response to the current may be monitored by the controller (not shown) that is coupled across the pixel by the prober 205 to provide defect information. Examples of electron beam testing are described in U.S. Pat. No. 5,369,359, issued Nov. 29, 1994 to Schmitt; U.S. Pat. No. 5,414,374, issued May 9, 1995 to Brunner et al.; U.S. Pat. No. 5,258,706, issued Nov. 2, 1993 to Brunner et al.; U.S. Pat. No. 4,985,681, issued Jan. 15, 1991 to Brunner et al.; and U.S. Pat. No. 5,371,459, issued Dec. 6, 1994 to Brunner et al., all of which are hereby incorporated by reference in therein entireties. The electron beam may also be electromagnetically deflected to allow a greater number of pixels to be tested at a given substrate table 550 position.

Figure 11:
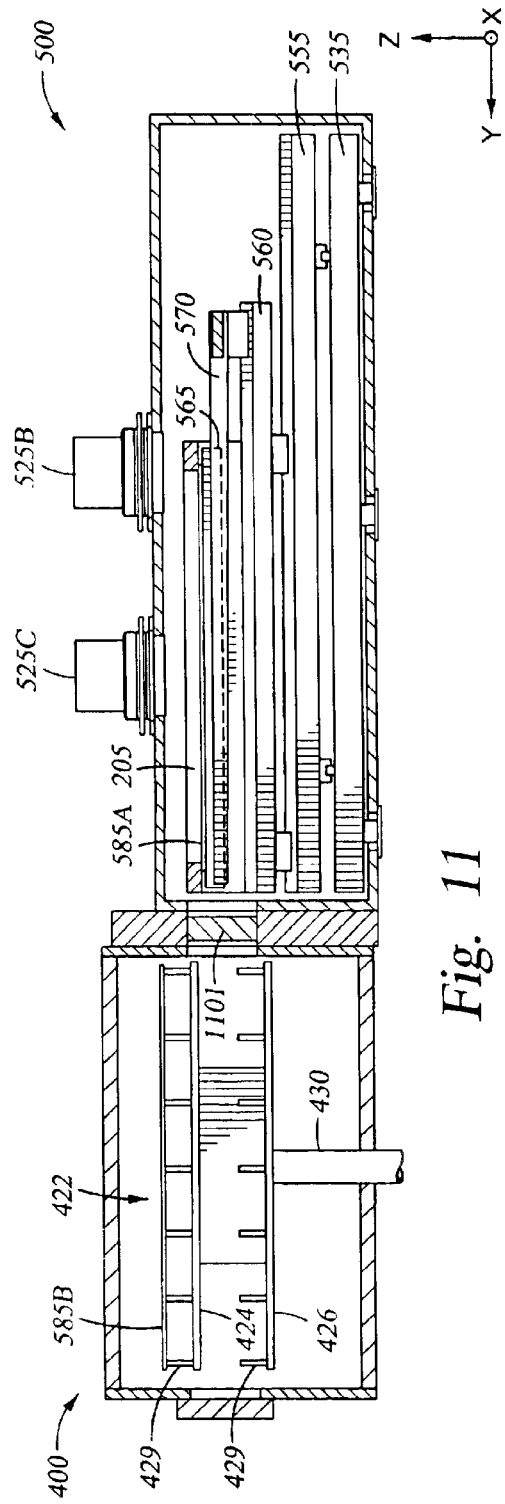

FIGS. 11–20 show partial cross section views of the load lock chamber 400 and the testing chamber 500 to illustrate the sequence of operation of the substrate table 550. FIG. 11 shows the Z-stage 565 in the "testing position." As shown, the slit valve 1101 between the load lock chamber 400 and the testing chamber 500 is closed. The substrate 585A is disposed on the upper surface of the Z-stage 565. The Z-stage 565 is raised above the fingers of the end effector 570, holding the substrate 585A against the prober 205. As described above but not shown in these cross sections, the lower stage 555 and the upper stage 560 move linearly in their respective directions to place discrete portions of the substrate 585A beneath at least one of the testing columns 525A–D. Once testing is complete, the tested substrate 585A is transferred from the testing chamber 500 and an untested substrate 585B from the load lock chamber 400 is inserted into the testing chamber 500.

Figure 12:
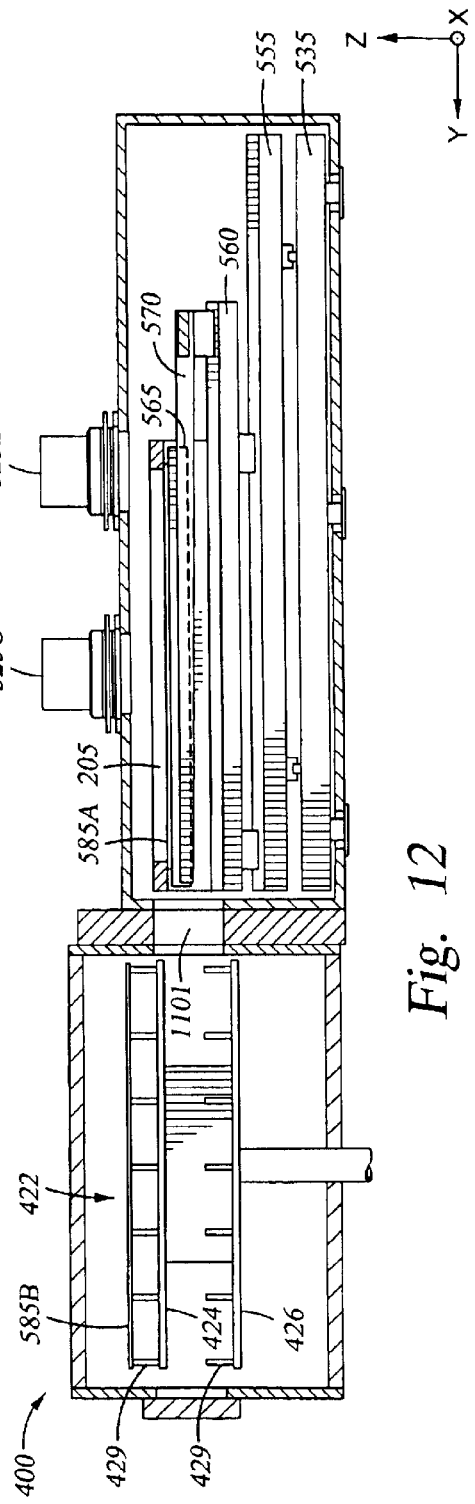
Figure 13:
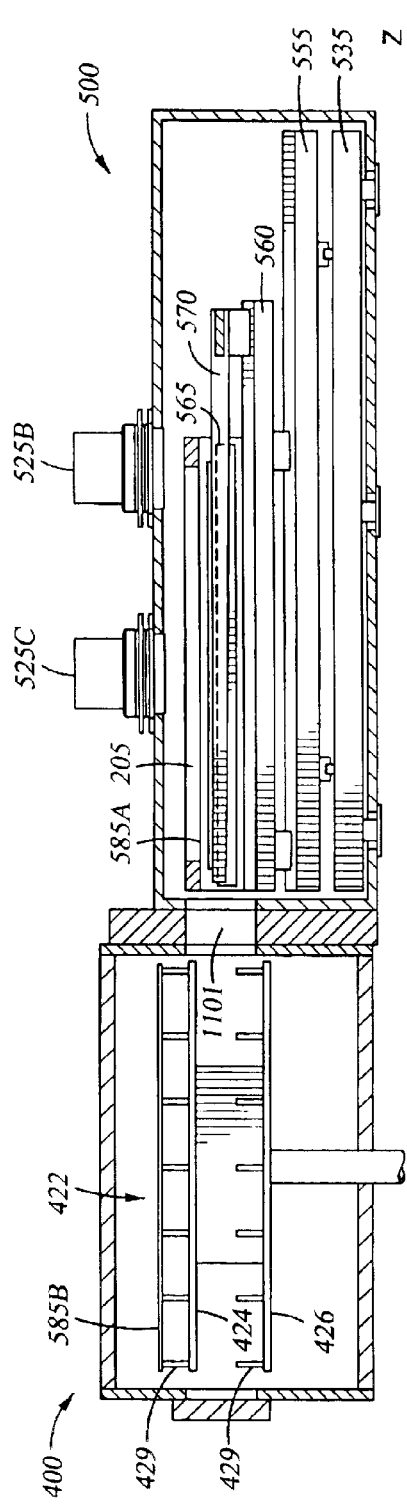
Figure 14:
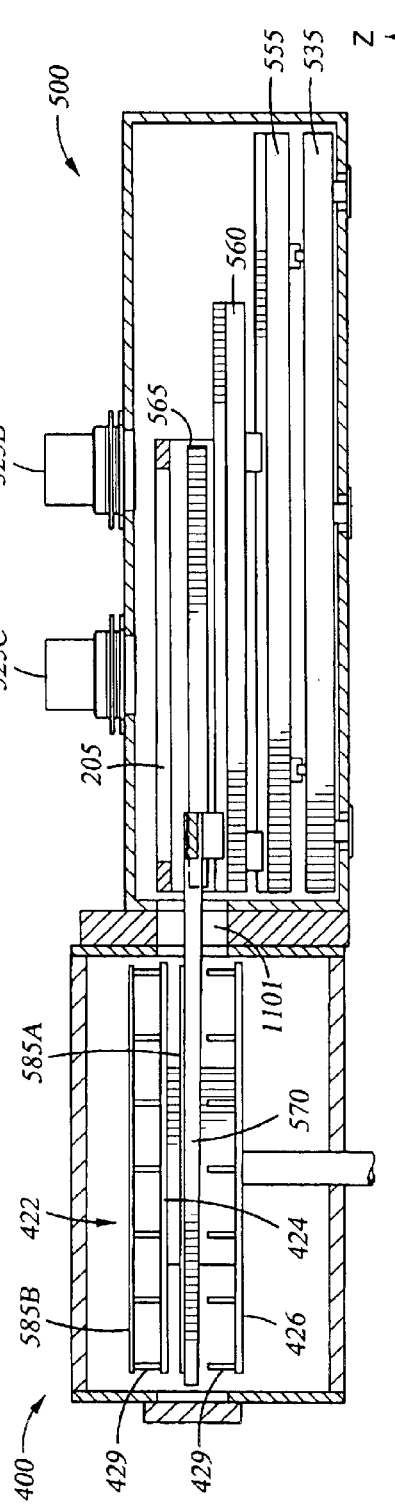
Figure 15:
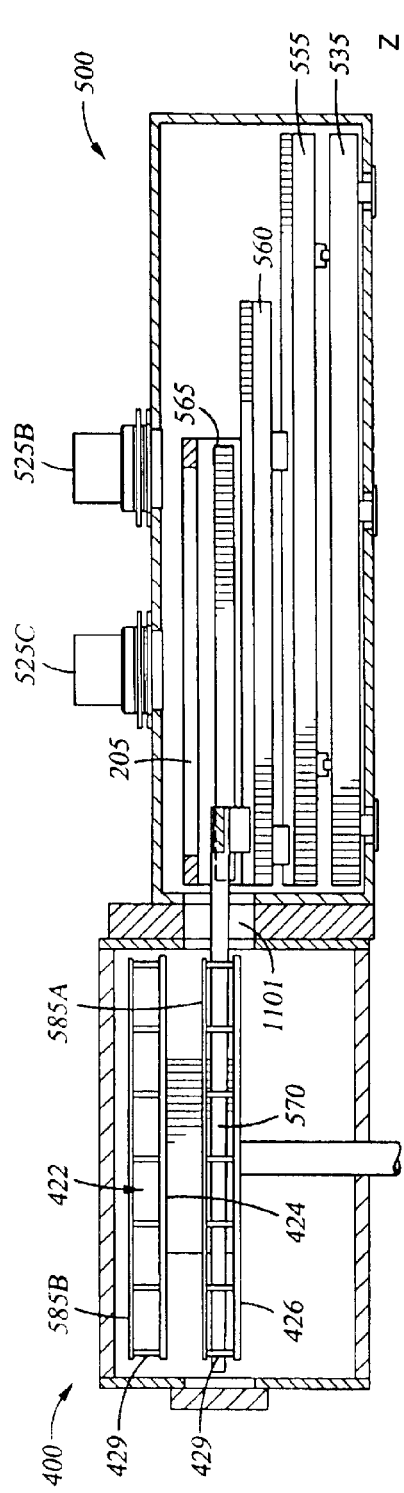
Figure 16:
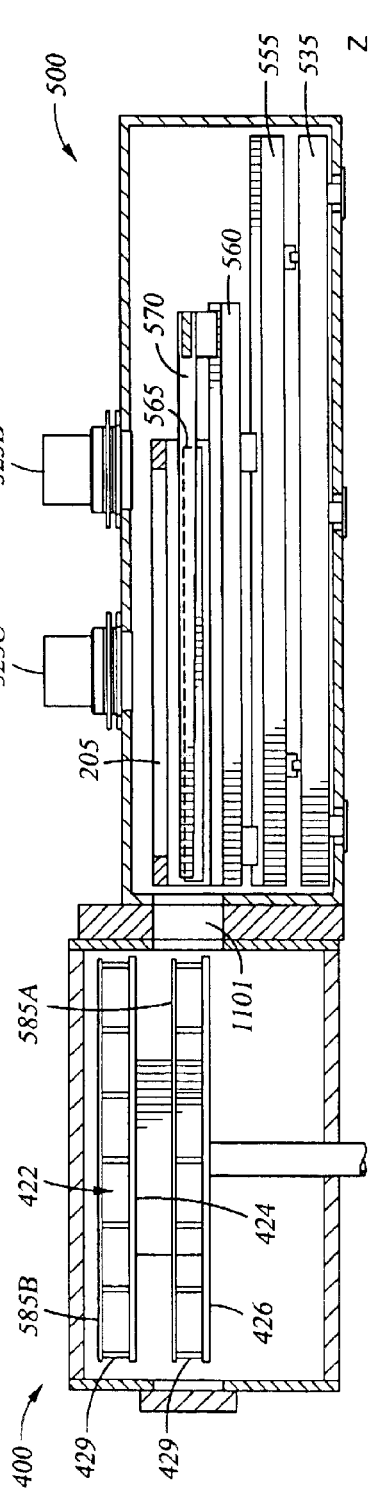

FIGS. 12 through 16 illustrate the transfer of the tested substrate 585A from the testing chamber 500 to the load lock chamber 400. To facilitate this transfer, the slit valve 1101 is opened as shown in FIG. 12. The Z-stage 565 is lowered transferring to the substrate 585A to the end effector 570 as shown in FIG. 13. The end effector 570 having the substrate 585A disposed thereon extends through the slit valve 1101 above the lower tray 424 of the dual substrate support 422, as shown in FIG. 14. The substrate support 422 is then raised to unload the substrate 585A from the end effector 570. The substrate 585A is disposed on and held by the pins 429, as shown in FIG. 15. The end effector 570 then retracts to the testing chamber 500, completing the exchange of the tested substrate 585A to the load lock chamber 400, as shown in FIG. 16.

Figure 17:
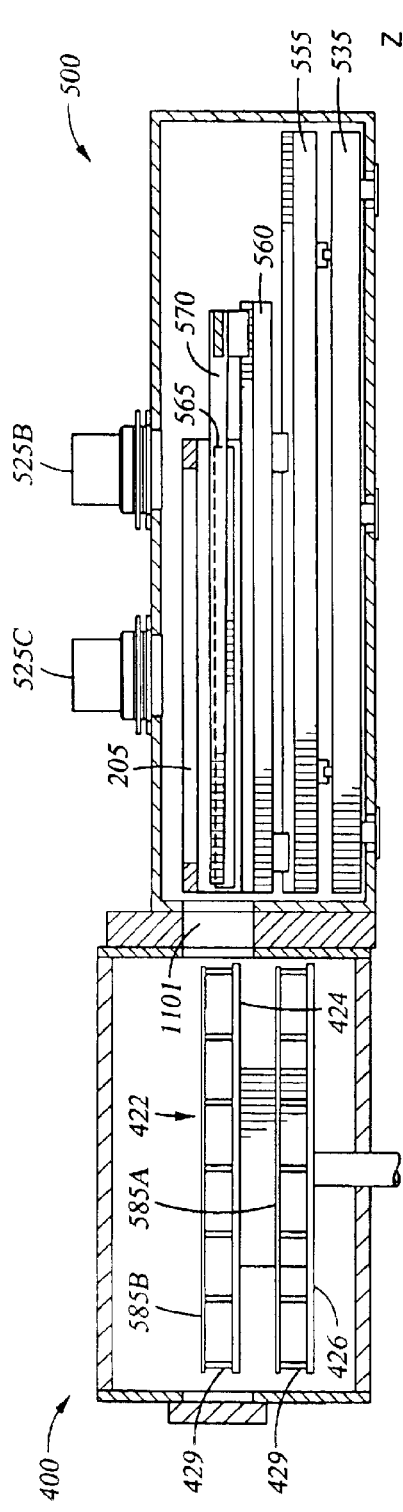
Figure 18:
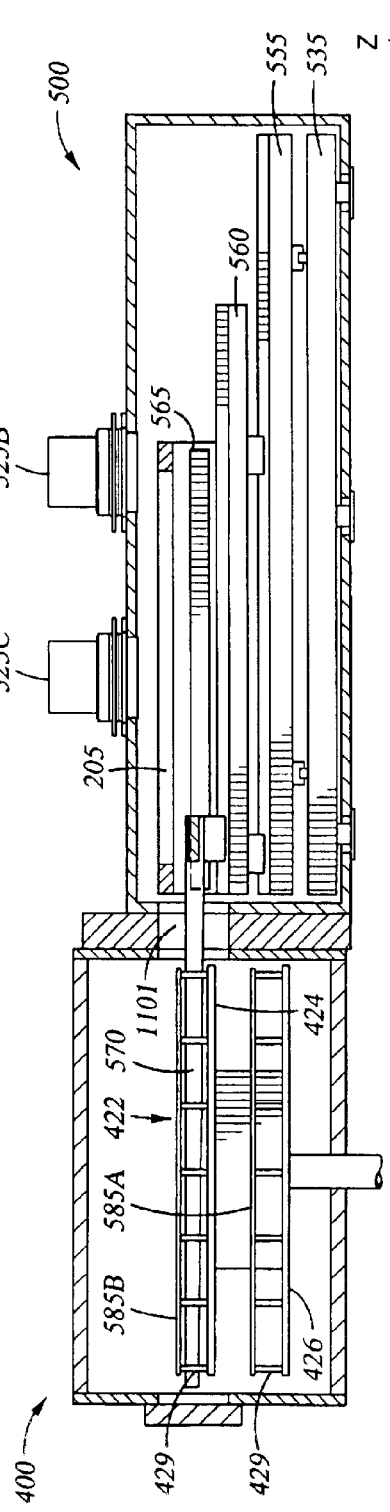

FIGS. 17–20 illustrate the transfer sequence of an untested substrate 585B to the testing chamber 500. To initiate this transfer, the dual substrate support 422 lowers to align the substrate 585B with the slit valve 1101, as shown in FIG. 17. The end effector 570 extends into the load lock chamber 400 as shown in FIG. 18, and the dual substrate support 422 lowers even further to load the substrate 585B onto the end effector 570 as shown in FIG. 19. The end effector 577 having the substrate 585B disposed thereon retracts into the test chamber 500 and the slit valve 1101 is closed, thereby completing the transfer of the untested substrate 585B from the load lock chamber 400 to the testing chamber 500, as shown in FIG. 20.

While the foregoing is directed to embodiments of the present invention, other and further embodiments of the invention may be devised without departing from the basic scope thereof, and the scope thereof is determined by the claims that follow.

What is claimed is:

1. An integrated electron beam testing system, comprising:
    a testing chamber having a substrate table disposed therein, the substrate table being adapted to move a substrate within the testing chamber in horizontal and vertical directions, the substrate table, comprising:
        a first stage moveable in a first dimension;
        a second stage moveable in a second dimension; and
        a third stage moveable in a third dimension, wherein each stage moves independently in its respective dimension;
    a load lock chamber disposed adjacent a first side of the testing chamber;
    a prober storage assembly disposed beneath the testing chamber;
    a prober transfer assembly disposed adjacent a second side of the testing chamber and arranged to transfer one or more probers between the prober storage assembly and the testing chamber; and
    one or more electron beam testing devices disposed on an upper surface of the testing chamber.

2. The system of claim 1, wherein each stage is adapted to move linearly.

3. The system of claim 1, wherein an upper surface of the third stage is adapted to support the substrate.

4. The system of claim 3, further comprising an end effector disposed within the testing chamber and adapted to transfer the substrate between the load lock chamber and the testing chamber.

5. The system of claim 4, wherein the end effector is disposed on an upper surface of the second stage and the third stage is capable of raising and lowering about the end effector.

6. The system of claim 5, wherein the third stage is adapted to be lowered to load a substrate on the end effector and to be elevated to unload the substrate from the end effector.

7. The system of claim 5, wherein the end effector is extendable into the load lock chamber to transfer substrates between the load lock chamber and the testing chamber.

8. The system of claim 1, wherein the load lock chamber comprises a substrate support having at least two support trays.

9. The system of claim 8, wherein the at least two support trays each comprise a plurality of support pins disposed on an upper surface thereof.

10. The system of claim 1, wherein the prober transfer assembly comprises a lift arm capable of transferring probers between the test chamber and the prober storage assembly.

11. The system of claim 10, wherein the prober transfer assembly is a modular unit having one or more wheels.

12. An integrated electron beam testing system, comprising:
    a testing chamber having a substrate table disposed therein, the substrate table comprising:
        a first stage moveable horizontally along an X axis;
        a second stage moveable horizontally along a Y axis; and
        a third stage moveable vertically along a Z axis;
    a load lock chamber disposed adjacent a first side of the testing chamber;
    a prober storage assembly disposed beneath the testing chamber;
    a prober transfer assembly disposed adjacent a second side of the testing chamber; and
    one or more electron beam testing devices disposed on an upper surface of a testing chamber.

13. The system of claim 12, wherein the one or more electron beam testing devices comprises four devices disposed above the substrate table.

14. The system of claim 12, wherein an upper surface of the third stage is adapted to support a substrate.

15. The system of claim 14, wherein the substrate is a flat panel display having a length and a width.

16. The system of claim 15, wherein the first stage is adapted to move the substrate table in the X direction by at least 50 percent of the width of the substrate.

17. The system of claim 15, wherein the second stage is adapted to move the substrate table in the Y direction by at least 50 percent of the length of the substrate.

18. The system of claim 12, further comprising an end effector disposed on the second stage which is extendable into the load lock chamber to transfer the substrate between the load lock chamber and the testing chamber.

19. The system of claim 18, wherein the end effector and the third stage are both slotted monoliths adapted to interdigitate when disposed on the same horizontal plane.

20. The system of claim 12, wherein the load lock chamber comprises a substrate support having at least two support trays.

21. The system of claim 20, wherein the at least two support trays each comprise a plurality of support pins disposed on an upper surface thereof.

22. The system of claim 12, wherein the prober transfer assembly comprises a lift arm capable of transferring probers between the test chamber and the prober storage assembly.

23. The system of claim 12, wherein the prober transfer assembly is arranged to transfer one or more probers between the prober storage assembly and the testing chamber.

24. A method for electron beam testing a substrate within an integrated electron beam test assembly, comprising:

loading a substrate to be tested into a testing chamber having a substrate table disposed therein, the substrate table being capable of moving the substrate within the testing chamber in horizontal and vertical directions, the substrate table, comprising:
a first stage moveable in a first dimension;
a second stage moveable in a second dimension; and
a third stage moveable in a third dimension, wherein each stage moves independently in its respective dimension;

elevating the third stage to position the substrate in a testing position;

testing the substrate using electron beams transmitted from one or more electron beam testing devices disposed on an upper surface of the testing chamber, wherein the first and second stages move in an X or Y direction to position the substrate beneath the one or more electron beam testing devices;

lowering the third stage to load the tested substrate on an upper surface of an end effector disposed on the second stage;

extending the end effector into a load lock chamber disposed adjacent a first side of the testing chamber;

unloading the substrate in the load lock chamber; and retracting the end effector.

25. The method of claim 24, further comprising transferring a prober stored beneath the transfer chamber using a prober transfer assembly disposed adjacent a second side of the testing chamber.

26. The method claim 25, wherein the prober is stored within a prober storage assembly disposed underneath the testing chamber.

27. The method of claim 24, wherein the substrate is a flat panel display having a length and a width.

28. The method of claim 27, wherein the first stage moves in the X direction by at least 50 percent of the width of the substrate.

29. The system of claim 27, wherein the second stage moves in the Y direction by at least 50 percent of the length of the substrate.

30. A method for electron beam testing a substrate within an integrated electron beam test assembly, comprising:

loading a substrate to be tested into a testing chamber having a substrate table disposed therein, the substrate table being movable in three dimensions;

depositing the substrate on the substrate table;

elevating the substrate to a testing position;

testing at least a portion of the substrate with an electron beam;

moving the substrate in at least one dimension to a different location with respect to the electron beam;

testing the substrate at the different location; and unloading the substrate from the testing chamber.

* * * * *

UNITED STATES PATENT AND TRADEMARK OFFICE
CERTIFICATE OF CORRECTION

PATENT NO. : 6,833,717 B1
DATED : December 21, 2004
INVENTOR(S) : Shinichi Kurita et al.

It is certified that error appears in the above-identified patent and that said Letters Patent is hereby corrected as shown below:

<u>Title page,</u>
Item [75], should read as follows:
-- Inventor(s): Shinichi Kurita, San Jose, CA (US);
Emanuel Beer, San Jose, CA (US);
Hung T. Nguyen, Fremont, CA (US);
Benjamin Johnston, Los Gatos, CA (US);
Fayez E. Abboud, Pleasanton, CA (US). --

Signed and Sealed this

Twenty-fourth Day of May, 2005

JON W. DUDAS
*Director of the United States Patent and Trademark Office*